US007978160B2

(12) United States Patent
Chung

(10) Patent No.: US 7,978,160 B2
(45) Date of Patent: *Jul. 12, 2011

(54) EMISSION DRIVER, EMISSION CONTROL SIGNAL DRIVING METHOD AND ELECTROLUMINESCENT DISPLAY INCLUDING SUCH AN EMISSION DRIVER

(75) Inventor: Bo Yong Chung, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 951 days.

This patent is subject to a terminal disclaimer.

(21) Appl. No.: 11/896,024

(22) Filed: Aug. 29, 2007

(65) Prior Publication Data

US 2008/0055207 A1  Mar. 6, 2008

(30) Foreign Application Priority Data

Aug. 31, 2006 (KR) .......................... 10-2006-0083757

(51) Int. Cl.
G09G 3/30 (2006.01)
G09G 3/32 (2006.01)

(52) U.S. Cl. ........................................... 345/82; 345/76

(58) Field of Classification Search .............. 345/76–82, 345/206, 211–214, 690; 315/161–164, 169.3, 315/170, 195–199, 299; 327/387, 389, 390, 327/391

See application file for complete search history.

(56) References Cited

U.S. PATENT DOCUMENTS

| 5,781,106 A | 7/1998 | Liger |
| 5,949,271 A * | 9/1999 | Fujikura ........................ 327/390 |
| 6,072,477 A | 6/2000 | Ueno |
| 6,720,942 B2 * | 4/2004 | Lee et al. ........................ 345/82 |
| 6,724,376 B2 | 4/2004 | Sakura et al. |
| 7,352,786 B2 * | 4/2008 | Ikeda .......................... 372/38.01 |
| 7,420,535 B2 * | 9/2008 | Senda ............................. 345/100 |
| 7,468,723 B1 * | 12/2008 | Collins ........................ 345/102 |
| 7,554,513 B2 * | 6/2009 | Sun et al. ........................ 345/77 |
| 7,710,368 B2 | 5/2010 | Chung |
| 2005/0141320 A1 | 6/2005 | Senda |
| 2006/0156121 A1 | 7/2006 | Chung |

FOREIGN PATENT DOCUMENTS

| JP | 2001-326569 | 11/2001 |
| JP | 2003-122304 | 4/2003 |
| KR | 10-2005-0002583 A | 1/2005 |
| KR | 10-2005-0065442 A | 6/2005 |
| KR | 10-2005-0122690 A | 12/2005 |
| KR | 10-2006-0081582 A | 7/2006 |

* cited by examiner

Primary Examiner — Kevin M Nguyen

(74) Attorney, Agent, or Firm — Lee & Morse, P.C.

(57) ABSTRACT

An emission driver may include a first signal processor adapted to receive a clock signal, an input signal and an inverse input signal, and to generate a first output signal, a second signal processor adapted to receive the first output signal, an inverse clock signal and negative feedback signals, and to generate a second output signal, a third signal processor adapted to receive the second output signal and the input signal, and to generate a third output signal that is an inverse signal to the second output signal, and a fourth signal processor adapted to receive the third output signal, and to generate a fourth output signal that is an inverse of the third output signal based on the third output signal, wherein the negative feedback signals include the third output signal and the fourth output signal.

20 Claims, 5 Drawing Sheets

EMISSION DRIVER, EMISSION CONTROL SIGNAL DRIVING METHOD AND ELECTROLUMINESCENT DISPLAY INCLUDING SUCH AN EMISSION DRIVER

BACKGROUND OF THE INVENTION

1. Field of the Invention

The present invention relates to an emission driver, an emission control signal and an electroluminescent display employing such an emission driver and/or an emission control signal. More particularly, the present invention relates to an emission driver, an emission control signal and an electroluminescent display, e.g., an organic electroluminescent display, employing such an emission driver and/or emission control signal, which employs only one of p-type or n-type transistors and may be lighter in weight, smaller in size, require less processing steps and/or may be lower in cost than conventional emission drivers and/or electroluminescent displays.

2. Description of the Related Art

A flat panel display device may include a plurality of pixels arranged on a substrate in an array to form a display region, and scan lines and data lines may be coupled to each pixel for selectively applying data signals to the pixels in order to display an image.

Flat panel display devices may be categorized into passive matrix type emission display devices and active matrix type emission display devices based on a driving scheme for driving the pixels. The active matrix type displays generally provide improved resolution, contrast and an operation speed.

Flat panel display devices are being used as a display device for portable information terminals, such as personal computers, mobile telephones, PDAs, etc., or as a monitor for various types of information equipment. Various types of flat panel display devices, e.g., liquid crystal displays (LCD) using liquid crystal panels, organic electroluminescent displays using organic light emitting elements, and plasma display devices (PDPs) using plasma panels.

Various emission display devices that are relatively light weight and occupy a relatively small volume as compared to cathode ray tubes are being developed, and electroluminescent displays, e.g., organic electroluminescent displays, which are capable of having excellent emission efficiency, brightness, viewing angle and relatively rapid response speeds are being researched and developed.

In conventional electroluminescent displays, e.g., organic electroluminescent displays, the emission driver employs both PMOS transistors and NMOS transistors. However, when a pixel unit of the electroluminescent display is formed only with PMOS transistor(s) or NMOS transistor(s), the pixel unit may be formed on a separate external driver and/or an additional process may be required for the emission driver if the emission driver is implemented using both PMOS transistors and NMOS transistors. Thus, such electroluminescent displays may be relatively large in size, may be relatively heavy, and manufacturing thereof may be complicated.

SUMMARY OF THE INVENTION

The present invention is therefore directed to an emission driver, an emission control signal driving method, and an electroluminescent display, e.g., organic electroluminescent display, including such an emission driver, which substantially overcome one or more of the problems due to the limitations and disadvantages of the related art.

It is therefore a feature of an embodiment of the present invention to provide an emission driver and an electroluminescent display including such an emission driver, which implement the emission driver with only p-type transistors, e.g., PMOS transistors, or n-type transistors, e.g., NMOS transistors.

It is therefore a separate feature of an embodiment of the present invention to provide an emission driver and an electroluminescent display thereof, which may be manufactured using a simplified process, may be lower in cost and/or size as compared to conventional emission drivers or electroluminescent displays.

At least one of the above and other features and advantages of the present invention may be realized by providing an emission driver including a first signal processor adapted to receive a clock signal, an input signal and an inverse input signal, and to generate a first output signal, a second signal processor adapted to receive the first output signal, an inverse clock signal and negative feedback signals, and to generate a second output signal, a third signal processor adapted to receive the second output signal and the input signal, and to generate a third output signal that is an inverse signal to the second output signal, and a fourth signal processor adapted to receive the third output signal, and to generate a fourth output signal that is an inverse of the third output signal based on the third output signal, wherein the negative feedback signals include the third output signal and the fourth output signal.

The first output signal may correspond to the inverse input signal delayed for a predetermined time. The second output signal may correspond to the first output signal corrected based on at least one of the negative feedback signals.

The first signal processor may include a first transistor adapted to control a supply of a driving source voltage corresponding to a driving power source based on the clock signal, a second transistor adapted to control the supply of the driving power source voltage supplied through the first transistor to a first node based on the input signal, a third transistor adapted to control current flow from the first node to a ground power source based on a voltage of a gate electrode thereof, a fourth transistor coupled between a source electrode and the gate electrode of the third transistor, and adapted to control a voltage between the source electrode and the gate electrode of the third transistor based on the input signal, a fifth transistor adapted to control a voltage of the gate electrode of the third transistor based on the inverse input signal, a sixth transistor coupled between the third transistor and the ground power source, and adapted to perform a switching operation based on the clock signal, and a first capacitor adapted to store a voltage corresponding to the gate electrode of the third transistor.

The second signal processor may include a seventh transistor coupled to a driving power source and adapted to perform a switching operation based on the inverse clock signal, an eighth transistor adapted to perform a switching operation based on the third output signal to transfer a driving source voltage corresponding to the driving power source supplied through the seventh transistor to a first node, a ninth transistor adapted to allow current to flow from a second node to a ground power source based on a voltage applied to a gate electrode thereof, a tenth transistor coupled between a source electrode and the gate electrode of the ninth transistor, and adapted to perform a switching operation based on the input signal to control a voltage between the source and the gate terminals of the ninth transistor, an eleventh transistor adapted to control the voltage of the gate electrode of the ninth transistor based on the fourth output signal, a twelfth transistor adapted to perform a switching operation based on the inverse clock signal to allow current to flow between the ninth transistor and the ground power source, and a second capacitor adapted to store the voltage of the gate electrode of the ninth transistor.

The third signal processor may include a thirteenth transistor adapted to perform a switching operation based on the second output signal to supply a driving power source voltage corresponding to a driving power source to a third node, a fourteenth transistor adapted to perform a switching operation based on a voltage of a gate electrode thereof to allow current to flow from the third node to a ground power source, a fifteenth transistor coupled between a source electrode and the gate electrode of the fourteenth transistor, and adapted to perform a switching operation based on the second output signal to control a voltage between the source and the gate electrodes of the fourteenth transistor, a sixteenth transistor adapted to perform a switching operation based on the input signal, and to control the voltage of the gate electrode of the fifteenth transistor, and a third capacitor adapted to store the voltage of the gate electrode of the fourteenth transistor.

The fourth signal processor may include a seventeenth transistor adapted to perform a switching operation based on the third output signal to supply a driving source voltage corresponding to a driving power source to a fourth node, an eighteenth transistor adapted to perform a switching operation based on a voltage of a gate electrode thereof to allow current to flow from the fourth node to a ground power source, a nineteenth transistor coupled between a source electrode and the gate electrode of the eighteenth transistor, and adapted to perform a switching operation based on the third output signal to control a voltage between the source and the gate electrodes of the eighteenth transistor, a twentieth transistor adapted to perform a switching operation based on the second output signal, and to control the voltage of the gate electrode of the eighteenth transistor, and a third capacitor adapted to store the voltage of the gate electrode of the eighteenth transistor.

The first, second, third and fourth signal processors may include a plurality of transistors, and the plurality of transistors may all be only one of p-type transistors and/or n-type transistors such that the first, second, third, and fourth signal processors all include the same type of transistors.

At least one of the above and other features and advantages of the present invention may be separately realized by providing an electroluminescent display including a pixel unit displaying adapted to display an image based on at least one pixel formed in a region defined by a data line, a scan line and an emission control line, a data driver adapted to transfer a data signal to the data line, a scan driver adapted to transfer a scan signal to the scan line, and an emission driver adapted to transfer an emission control signal to the emission control line, wherein the emission driver may include a first signal processor adapted to receive a clock signal, an input signal and an inverse input signal, and to generate a first output signal, a second signal processor adapted to receive the first output signal, an inverse clock signal and negative feedback signals, and to generate a second output signal, a third signal processor adapted to receive the second output signal and the input signal and generate a third output signal that is an inverse signal to the second output signal, and a fourth signal processor adapted to receive the third output signal, and to generate a fourth output signal that is an inverse of the third output signal based on the third output signal, wherein the negative feedback signals include the third output signal and the fourth output signal. The electroluminescent display may be an organic electroluminescent display.

At least one of the above and other features and advantages of the present invention may be separately realized by providing an emission control signal driving method including receiving a clock signal, an input signal and an inverse input signal, storing a predetermined voltage corresponding to the input signal, outputting a signal corresponding to the predetermined voltage and a signal corresponding to an inverse of the predetermined voltage after a predetermined time delay, and receiving the signal corresponding to the predetermined voltage and correcting the signal corresponding to the predetermined voltage based on an inverse clock signal and negative feedback signals corresponding to the predetermined voltage and the inverse voltage.

The method may further include controlling a switching means to output the corrected signal corresponding to the predetermined voltage, the corrected output signal having a preset voltage level of power source irrespective of a voltage across the switching means. The method may further include inverting the corrected signal and supplying the inverted corrected signal as an emission control signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
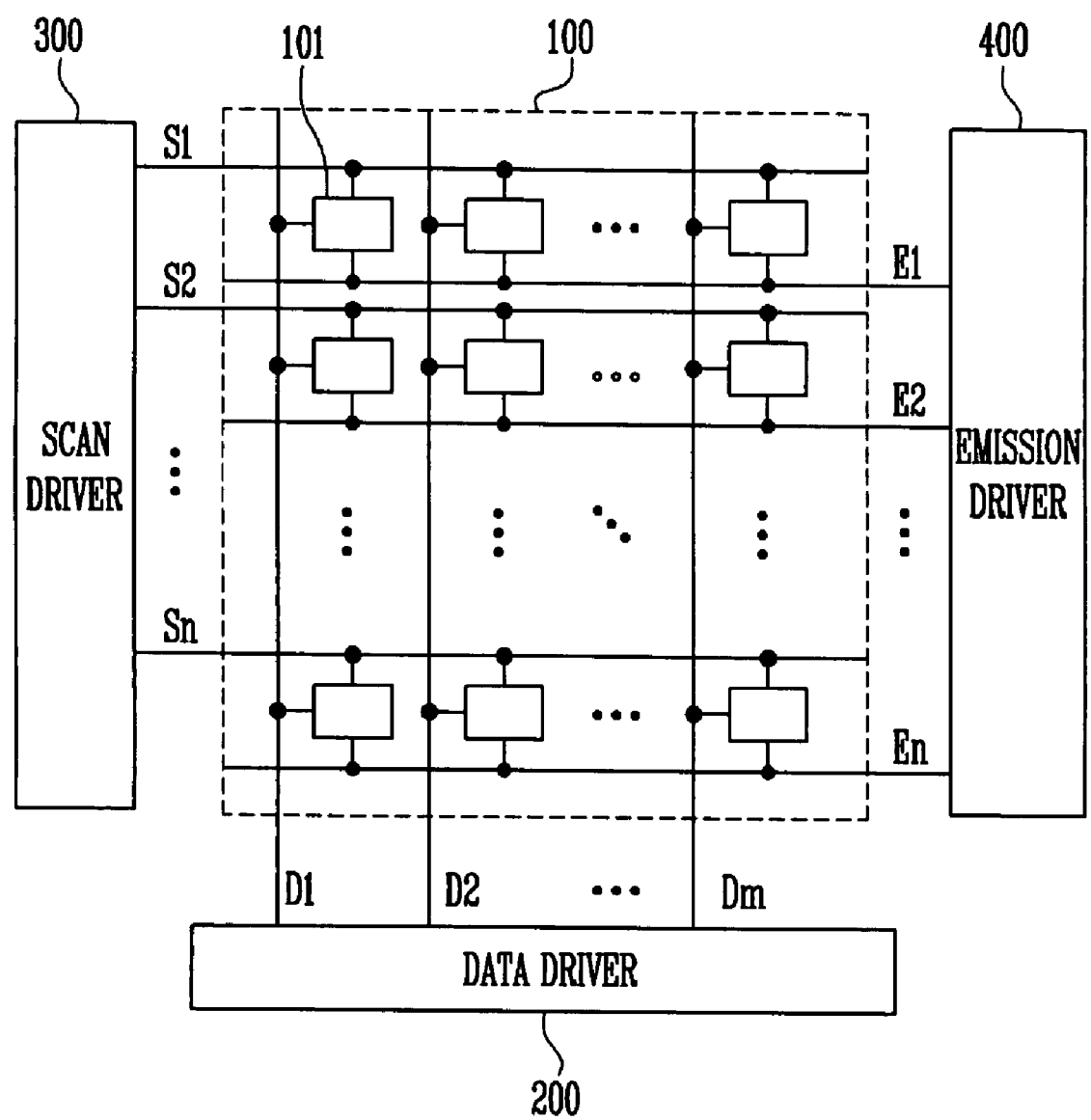
FIG. 1 illustrates a block diagram of an electroluminescent display according to an exemplary embodiment of the present invention.

Korean Patent Application No. 10-2006-0083757, filed on Aug. 31, 2006, in the Korean Intellectual Property Office, and entitled: "Emission Driver, Emission Control Signal Driving Method and Organic Electro Luminescence Display Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

FIG. 1 illustrates a block diagram of an electroluminescent display according to an exemplary embodiment of the present invention. The electroluminescent display may be an organic electroluminescent display.

Referring to FIG. 1, an electroluminescent display may include a pixel unit 100, a data driver 200, a scan driver 300 and an emission driver 400.

The pixel unit 100 may include a plurality of data lines D1, D2 . . . Dm-1, Dm, a plurality of scan lines S1, S2 . . . Sn-1, Sn, a plurality of emission control lines E1, E2 . . . En-1, En, and a plurality of pixels 101 formed in the region defined by the plurality of data lines D1, D2 . . . Dm-1, Dm, the plurality of scan lines S1, S2 . . . Sn-1, Sn, and the plurality of emission control lines E1, E2 . . . En-1, En.

The pixel(s) 101 may include a pixel circuit and an organic light emitting element, and may generate a pixel current flowing into the pixel via data signals transferred through the plurality of the data lines D1, D2 . . . Dm-1, Dm and scan signals transferred through the plurality of the scan lines S1, S2 . . . Sn-1, Sn, in the pixel circuit. Each of the pixels may control the pixel current flowing to the respective organic light emitting element via emission control signals transferred through the plurality of emission control lines E1, E2 . . . En-1, En.

The data driver 200, which may be coupled to the plurality of data lines D1, D2 . . . Dn-1, Dm, may generate data signals and may sequentially transfer the data signal corresponding to one row of the pixel unit 100 to the plurality of data lines D1, D2 . . . Dm-1, Dm.

The scan driver 300, which may be coupled to the plurality of scan lines S1, S2 . . . Sn-1, Sn, may generate scan signals and may transfer them to the plurality of scan lines S1, S2 . . . Sn-1, Sn. A particular row may be selected by the scan signal, and the data signal may be transferred to the pixel 101 associated with, e.g., arranged in, the selected row, generating the current corresponding to the data signal in the respective pixel 101.

The emission driver 400, which may be coupled to the plurality of emission control lines E1, E2 . . . En-1, En, may generate emission control signals and may transfer them to the plurality of emission control lines E1, E2 . . . En-1, En. The emission driver 400 may control a pulse width and a number of pulses of the respective emission control signal(s). The pixel(s) 101 coupled to the emission control lines E1, E2 . . . En-1, En may receive the respective emission control signals to determine when the current generated in the pixel 101 is to flow into the light emitting element. In some embodiments of the invention, the emission driver 400 may be implemented as a circuit employing only one-type of transistor, e.g., p-type transistor such as PMOS transistors. Thus, when the pixel unit 100 is formed, the pixel unit 100 need not be separately formed, e.g., on a substrate using a separate process or a separate chip.

Figure 2:
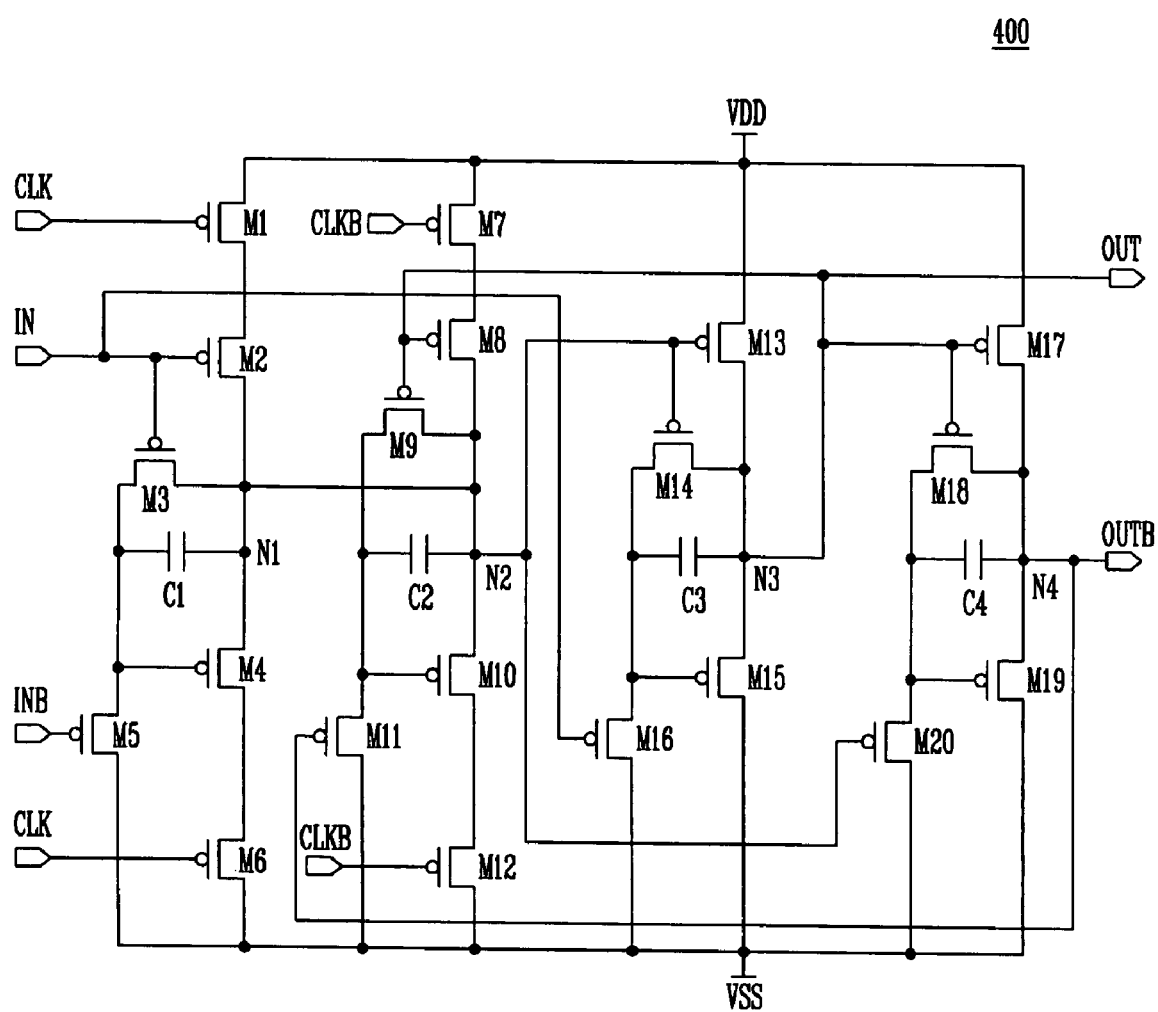
FIG. 2 illustrates a circuit diagram of a first exemplary embodiment of an emission driver employable by the electroluminescent display of FIG. 1.

FIG. 2 illustrates a circuit diagram of a first exemplary embodiment of an emission driver 400 employable by the display of FIG. 1.

Referring to FIG. 2, the emission driver 400 may include a first signal processor, a second signal processor, a third signal processor, and a fourth signal processor, and may operate by receiving a clock signal CLKS, an inverse clock signal CLKBS, an input signal INS and an inverse input signal INBS. However, embodiments of the invention are not limited to an emission driver including first, second, third and fourth signal processors.

The first signal processor may include a first transistor M1, a second transistor M2, a third transistor M3, a fourth transistor M4, a fifth transistor M5, a fifth transistor M6 and a first capacitor C1.

A source terminal of the first transistor M1 may be coupled to a driving power source VDD. A drain terminal of the first transistor M1 may be coupled to a source terminal of the second transistor M2, and a gate terminal of the first transistor M1 may be coupled to a clock terminal CLK.

A drain terminal of the second transistor M2 may be coupled to a first node N1, and a gate terminal thereof may be coupled to an input signal terminal IN.

A source terminal of the third transistor M3 may be coupled to the first node N1, a drain terminal thereof may be coupled to a source terminal of the fifth transistor M5. A gate terminal of the third transistor M3 may be coupled to the input terminal IN.

A source terminal of the fourth transistor M4 may be coupled to the first node N1, a drain terminal thereof may be coupled to a source terminal of the sixth transistor M6. A gate terminal of the fourth transistor M4 may be coupled to the source terminal of fifth transistor M5.

A source terminal of the fifth transistor M5 may be coupled to the drain terminal of the third transistor M3. A drain terminal of the fifth transistor M5 may be coupled to a ground power source VSS. A gate terminal of the fifth transistor M5 may be coupled to an inverse input signal terminal INB.

A gate terminal of the sixth transistor M6 may be coupled to the clock terminal CLK. A drain terminal of the sixth transistor M6 may be coupled to the ground power source VSS.

A first terminal of the first capacitor C1 may be coupled to the first node N1, and a second terminal thereof may be coupled to the gate terminal of the fourth transistor M4.

The second signal processor may include a seventh transistor M7, an eighth transistor M8, a ninth transistor M9, a tenth transistor M10, an eleventh transistor M11, a twelfth transistor M12 and a second capacitor C2.

A source terminal of the seventh transistor M7 may be coupled to the driving power source VDD. A drain terminal of the seventh transistor M7 may be coupled to a source terminal of the eighth transistor M8. A gate terminal of the seventh transistor M7 may be coupled to an inverse clock terminal CLKB.

A drain terminal of the eighth transistor M8 may be coupled to a second node N2. A gate terminal of the eighth transistor M8 may be coupled to a gate terminal of the ninth transistor M9. A drain terminal of the eighth transistor M8 may be coupled to the second node N2. The second node N2 may be coupled to the first node N1 of the first signal processor. The first node N1 may supply an output signal of the first signal processor.

A source terminal of the ninth transistor M9 may be coupled to the second node N2. A drain terminal of the ninth transistor may be coupled to a gate electrode of the tenth transistor M10, a source electrode of the eleventh transistor M11, and a second terminal of the second capacitor C2. A first terminal of the second capacitor C2 may be coupled to the second node N2.

A source electrode of the tenth transistor M10 may be coupled to the second node N2. A drain electrode of the tenth transistor M10 may be coupled to a source electrode of the twelfth transistor M12.

A gate electrode of the eleventh transistor M11 may be coupled to a fourth node N4. A drain electrode of the eleventh transistor M11 may be coupled to the ground power source VSS.

A gate terminal of the twelfth transistor M12 may be coupled to inverse clock terminal CLKB. A drain terminal of the twelfth transistor M12 may be coupled to the ground power source VSS.

The third signal processor may include a thirteenth transistor M13, a fourteenth transistor M14 and a fifteenth transistor M15, a sixteenth transistor M16 and a third capacitor C3.

A source terminal of the thirteenth transistor M13 may be coupled to the driving power source VDD, a drain terminal of the thirteenth transistor M13 may be coupled to a third node N3. A gate terminal of the thirteenth transistor M13 may be coupled to the second node N2.

A source terminal of the fourteenth transistor M14 may be coupled to the third node N3. A drain terminal of the fourteenth transistor M14 may be coupled to a gate terminal of the fifteenth transistor M15 and a source terminal of the sixteenth transistor M16. A gate terminal of the fourteenth transistor M14 may be coupled to the second node N2.

A source terminal of the fifteenth transistor M15 may be coupled to the third node N3. A drain terminal of the fifteenth transistor M15 may be coupled to the ground power source VSS.

A gate terminal of the sixteenth transistor M16 may be coupled to the input terminal IN. A drain terminal of the sixteenth transistor M16 may be coupled to the ground power source.

A first electrode of the third capacitor C3 may be coupled to the source terminal of the fifteenth transistor M15, the third node N3 and the output signal terminal OUT. A second electrode of the third capacitor C3 may be coupled to the gate terminal of the fifteenth transistor M15. The third node N3 may be coupled to the output signal terminal OUT.

The fourth signal processor may include a seventeenth transistor M17, an eighteenth transistor M18, a nineteenth transistor M19, a twentieth transistor M20, and a fourth capacitor C4.

A source terminal of the seventeenth transistor M17 may be coupled to the driving power source VDD. A gate terminal of the seventeenth transistor M17 may be coupled to the third node N3. A drain terminal of the seventeenth transistor M17 may be coupled to a source terminal of the eighteenth transistor.

A gate terminal of the eighteenth transistor M18 may be coupled to the third node N3 and the gate terminal of the seventeenth transistor M17. A drain terminal of the eighteenth transistor M18 may be coupled to a gate terminal of the nineteenth transistor M19.

A source terminal of the nineteenth transistor M19 may be coupled to a fourth node N4. A drain terminal of the nineteenth transistor M19 may be coupled to the ground power source VSS.

A source terminal of the twentieth transistor M20 may be coupled to the gate terminal of the nineteenth transistor M19, and a gate terminal of the twentieth transistor M20 may be coupled to the second node N2. The second node N2 may supply an output signal of the second signal processor. A drain terminal of the twentieth transistor M20 may be coupled to ground power source VSS.

A first terminal of the fourth capacitor C4 may be coupled to the fourth node N4, and a second terminal of the fourth capacitor C4 may be coupled to the gate terminal of the nineteenth transistor M19. The fourth node N4 may correspond to an inverse output signal terminal OUTB.

In the exemplary embodiment illustrated in FIG. 2, the first to the twentieth transistors M1 to M20 are implemented as p-type transistors, e.g., PMOS transistors. However, embodiments of the invention are not limited to p-type transistors.

Figure 3:
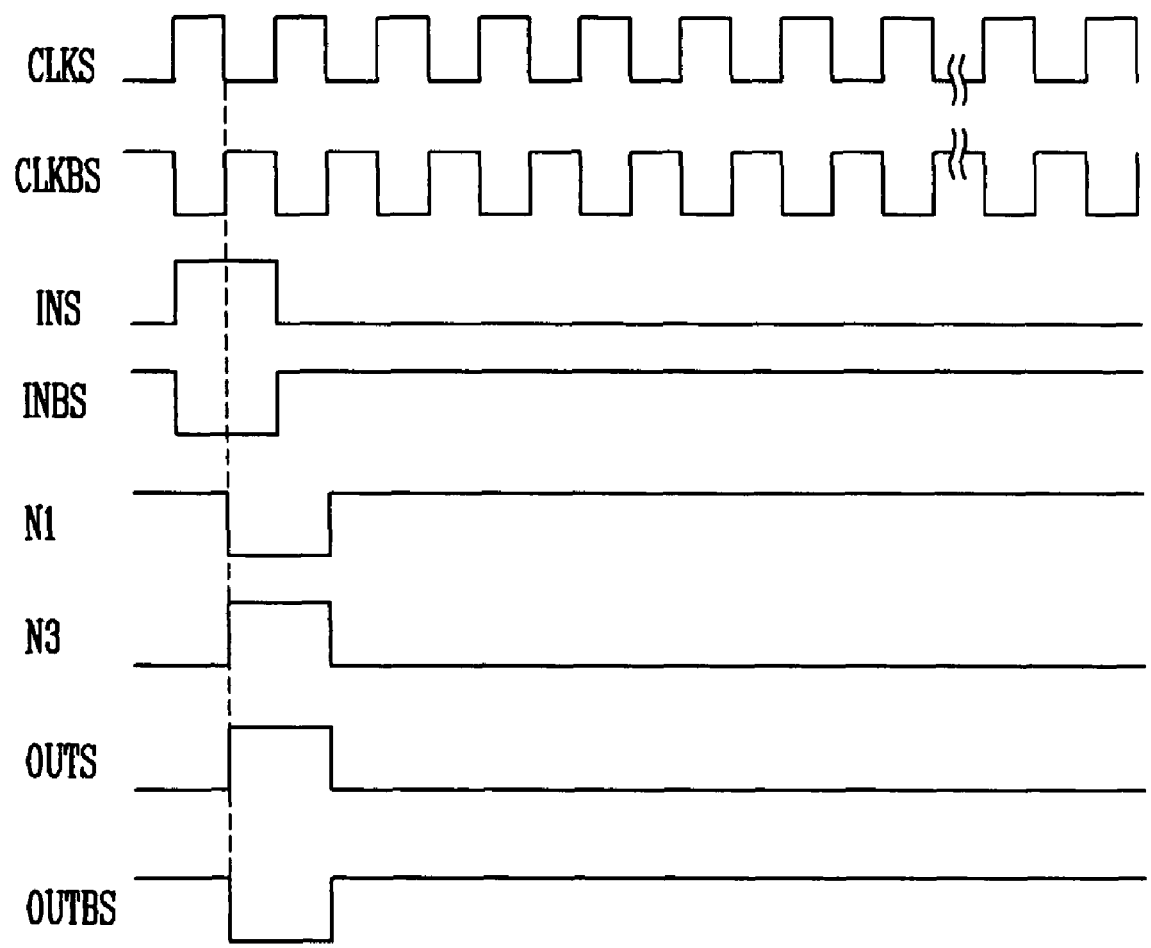
FIG. 3 illustrates a timing diagram of an exemplary operation of the emission driver of FIG. 2.

FIG. 3 illustrates a timing diagram of an exemplary operation of the emission driver 400 shown in FIG. 2.

Referring to FIGS. 2 and 3, the emission driver 400 may include the first signal processor, the second signal processor, the third signal processor, and the fourth signal processor.

The first signal processor may receive the clock signal CLKS, the input signal INS and the inverse input signal INBS. The second signal processor may receive the inverse clock signal INBS and an output signal of the first signal processor, and may receive an output signal of the third signal processor and an output signal of the fourth signal processor via negative feedback, e.g., the output signal of the third signal processor and the output signal of the fourth signal processor may be fed-back to the second signal processor. Further, as shown in FIG. 2, the output signal of the third signal processor may be output through the output signal terminal OUT, and the output signal of the fourth signal processor may be output to the inverse output signal terminal OUTB. The output signal of the third signal processor may be an inverse of the output signal output of the fourth signal processor. The third signal processor may receive the input signal INS via the input signal terminal IN and the output signal of the second signal processor via the second node N2. The fourth signal processor may receive the output signal of the second signal processor via the second node N2 and the output signal of the third signal processor via the third node N3.

In the first signal processor, when the clock signal CLKS is at a low state, the input signal INS is at a low state and the inverse input signal INBS is at a high state, the fifth transistor M5 may be in an off state, the first transistor M1, the second transistor M2, the third transistor M3 and the sixth transistor M6 may be in an on state. As a result of the first and second transistors M2, M3 being in an on state, a voltage corresponding to the driving power source VDD may be transferred to the first node N1. At this time, the gate and source terminals of the fourth transistor M4 may have a same voltage by way of the third transistor M3 and thus, the fourth transistor M4 may interrupt current flow in a direction from the source to the drain terminals thereof, i.e., to the sixth transistor M6. Therefore, a voltage of the first node N1 may correspond to, e.g., be maintained at, the voltage of the driving power source VDD. As a result of no current flowing through the fourth transistor M4, power consumption of the emission driver may also be reduced.

When the clock signal CLKS is at a high state, the inverse clock CLKBS is at a low state, the input signal INS is at a high state and the inverse input signal INBS is at a low state, the first transistor M1, the second transistor M2, the third transistor M3 and the sixth transistor M6 may be in an off state, and the fifth transistor M5 may be in an on state and may lower a voltage at the gate terminal of the fourth transistor M4. Under such circumstances, no current may flow through the fourth transistor M4 as the sixth transistor M6 may be in an off state. Thus, if, e.g., the voltage at the first node N1 corresponded to the voltage of the driving power source VDD prior to the clock signal CLKS and the input signal INS being at a high state, the first node N1 may be maintained at the voltage of the driving power source VDD. Also, under such circumstances, because no current may flow into the fourth transistor M4, power consumption may be reduced, e.g., by interrupting a path of current flow, i.e., charge dissipation, to the ground power source VSS.

Referring still to FIG. 3, when the clock signal CLKS is at a low state, e.g., transitions to the low state, the input signal INS is at a high state, e.g., maintains a high state, and the inverse input signal INBS is at a low state, e.g., transitions to the low state, the first transistor M1, the fifth transistor M5 and the sixth transistor M6 may be in an on state, the second transistor M2 and the third transistor M3 may be in an off state, the gate terminal of the fourth transistor M4 may be in a low state by way of the fifth transistor M5, and a voltage of the first node N1 may drop to a voltage of the ground power source VSS through the fourth transistor M4 and the sixth transistor M6. At this time, when the clock signal CLKS transitions to a high state and the input signal INS transitions to a low state, the first transistor M1, the fifth transistor M5 and the sixth transistor M6 may be in an off state, the second transistor M2 and the third transistor M3 may be in an on state, and the first node N1 may have a voltage corresponding to the ground power source VSS, e.g., maintain the voltage of the ground power source VSS.

Next, when the clock signal CLKS is at a low state, e.g., transitions to the low state, and the input signal INS is at a low state, e.g., maintains the low state, the first transistor M1, the second transistor M2, the third transistor M3 and the sixth transistor M6 may be in an on state, the fifth transistor M5 may be in an off state, the fourth transistor M4 may be diode coupled, i.e., the gate and source terminals of the fourth transistor M4 may be coupled, by way of the third transistor M3, and the first node N1 may have a voltage corresponding to the driving power source VDD.

Referring now to the second signal processor, the second signal processor may receive the voltage of the first node N1 corresponding to the output signal of the first signal processor, voltage(s) of the negative feedback signal(s) from the third and/or fourth signal processors, e.g., the voltage of the third node N3 corresponding to the output signal terminal OUT and the output signal of the third signal processor and the voltage of the fourth node N4 corresponding to the inverse output signal terminal OUTB and the output signal of the fourth signal processor, and the inverse clock signal CLKBS.

Next, when the inverse clock signal CLKBS is at a high state, the first node N1 of the first signal processor has a voltage corresponding to the driving power source VDD, e.g., maintains the voltage of the driving power source VDD, and the voltage of the output terminal OUT maintains a low state, the seventh transistor M7 and the twelfth transistor M12 may be in an off state, and the eighth transistor M8 and the ninth transistor M9 may be in an on state. Under such circumstances, the eleventh transistor M11 may be in an off state by way of the voltage of the inverse output terminal OUTB. At this time, as a result of the ninth transistor M9, the tenth transistor M10 may interrupt current flow in a direction from the source terminal to the drain terminal thereof and a voltage of the second node N2 may be maintained.

When the eleventh transistor M11 is in an on state as a result of, e.g., the voltage at the inverse output terminal OUTB, which may be negatively fed back to the eleventh transistor M11, and the twelfth transistor M12 is in an on state by way of, e.g., the inverse clock signal CLKBS, the voltage of the second node N2 may drop to the voltage of the ground power source and may reduce power consumption of the emission driver 400.

Referring now to the third signal processor, the third signal processor may receive the voltage of the second node N2, and the input signal INS via the input terminal IN. When the voltage of the second node N2 is in a low state, the voltage of the third node N3 corresponding to the output signal of the third signal processor may be in a high state, i.e., the thirteenth transistor M13 may be in an on state and a path may be open between the driving power source VDD and the third node N3, and when the voltage of the second node N2 is in a high state, the voltage of the third node N3 may be in a low state, i.e., the thirteenth transistor M13 may be in an off state and there may not be an open path between the driving power source VDD and the third node N3. The third node N3 may be coupled to the output terminal OUT so that the voltage of the third node N3 may correspond to an emission control signal. At this time, the voltage between the source and gate terminals of the fifteenth transistor M15 may be the same by way of the fourteenth transistor M14 and current may be prevented from flowing through the fifteenth transistor M15 in a direction from the source terminal to the drain terminal thereof, and as a result, power consumption may be decreased.

When the sixteenth transistor M16 is in an off state, e.g., transitions to the off state, by way of, e.g., the input signal INS of the input terminal IN, a voltage of the gate terminal of the fifteenth transistor M15 may drop by way of, e.g., the ground power source VSS. When the voltage of the gate terminal of the fifteenth transistor M15 drops to a magnitude of a threshold voltage of the sixteenth transistor M16, the sixteenth transistor M16 may be in a floating state and the voltage of the gate terminal of the fifteenth transistor M15 may not drop further. At this time, as a voltage higher than a threshold voltage of the sixteenth transistor M16 may be stored in the third capacitor C3, current may continuously flow into the fifteenth transistor M15 and may drop the voltage of the third node N3 to the voltage of the ground power source VSS. As a result, during operation of the emission driver 400, a low signal at the third node N3 may be dropped to the voltage of the ground power source VSS and signal characteristics of the output signal of the third signal processor may be improved, e.g., signal characteristics of the output signal of the third signal processor may be excellent.

Referring now to the fourth signal processor, the fourth signal processor may generate an inverse output signal OUTBS, which may be output therefrom via the inverse output terminal OUTB of the emission driver 400, and may be negatively fed back to the second signal processor. The fourth signal processor may receive the voltage of the second node N2 and the voltage of the third node N3, i.e., the voltage of the output signal of the second signal processor and the voltage of the output signal of the third signal processor. When the voltage of the third node N3, which may be coupled to the gate terminals of the seventeenth transistor M17 and the eighteenth transistor M18, is in a low state, the seventeenth transistor M17 and the eighteenth transistor M18 may be in an on state and may transfer the driving power source VDD to the output terminal OUT. When the voltage of the third node N3 is in a high state, the seventeenth transistor M17 and the eighteenth transistor M18 may be in an off state. Voltages of the gate terminals of the nineteenth transistor M19 and the twentieth transistor M20 may be controlled based on the voltage of the second node so that the inverse output signal OUTBS may be output from the inverse output terminal OUTB. The threshold voltage of the nineteenth transistor M19 may be maintained by the fourth capacitor C4 so that signal characteristics of the inverse output signal OUTBS may be excellent.

In embodiments of the invention, if a width of a pulse of the input signal INS is long by way of the operation of the first to fourth signal processors, a width of a pulse of the output signal OUTS may be long, and if a width of a pulse of the input signal INS is short, a width of a pulse of the output signal may be short. A number of pulses of the input signal INS may be identical to a number of pulses of the output signal OUTS so that a width of pulse(s) of the emission control signal and the number thereof can be controlled using the input signal INS.

Figure 4:
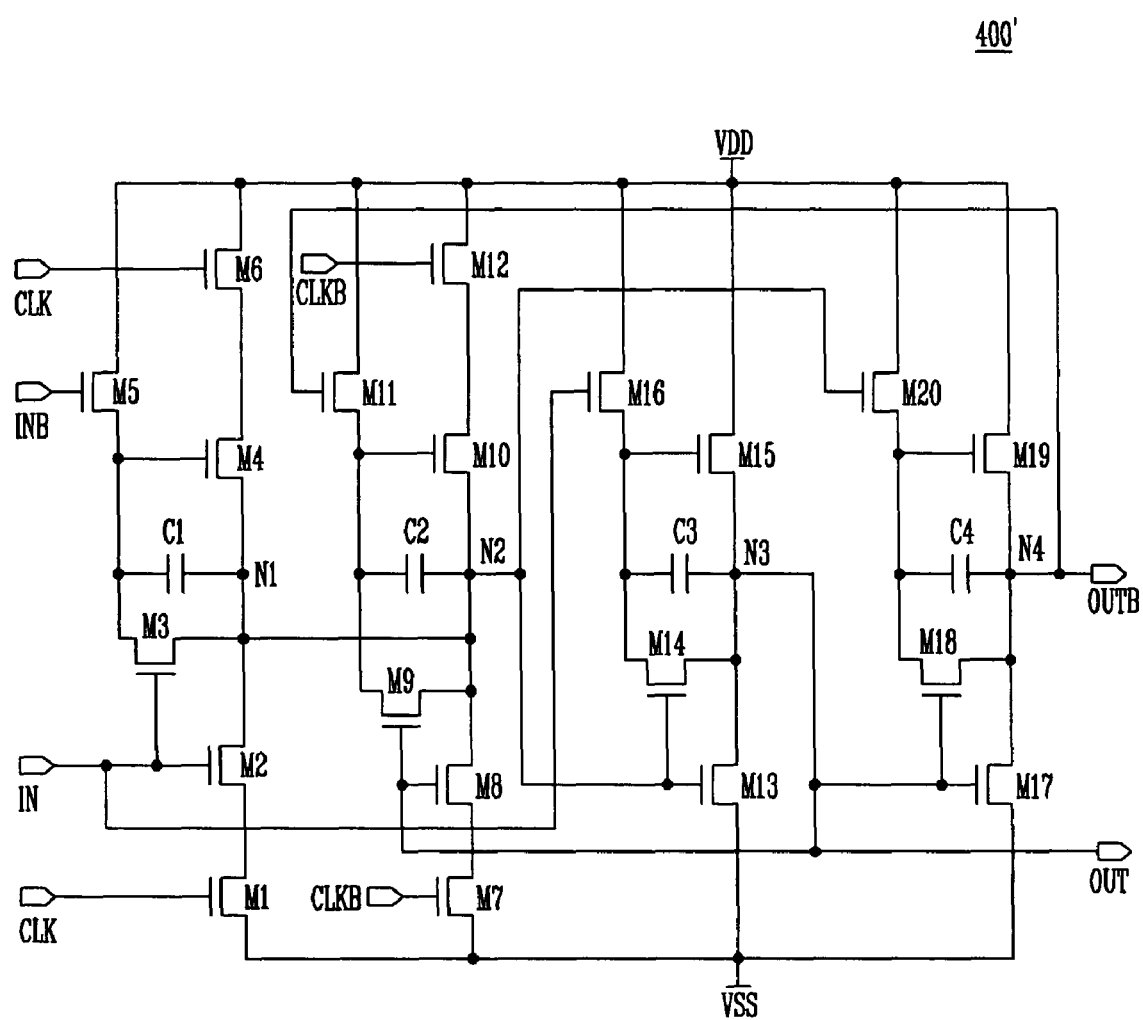
FIG. 4 illustrates a circuit diagram of a second exemplary embodiment of an emission driver employable by the display of FIG. 1.
Figure 5:
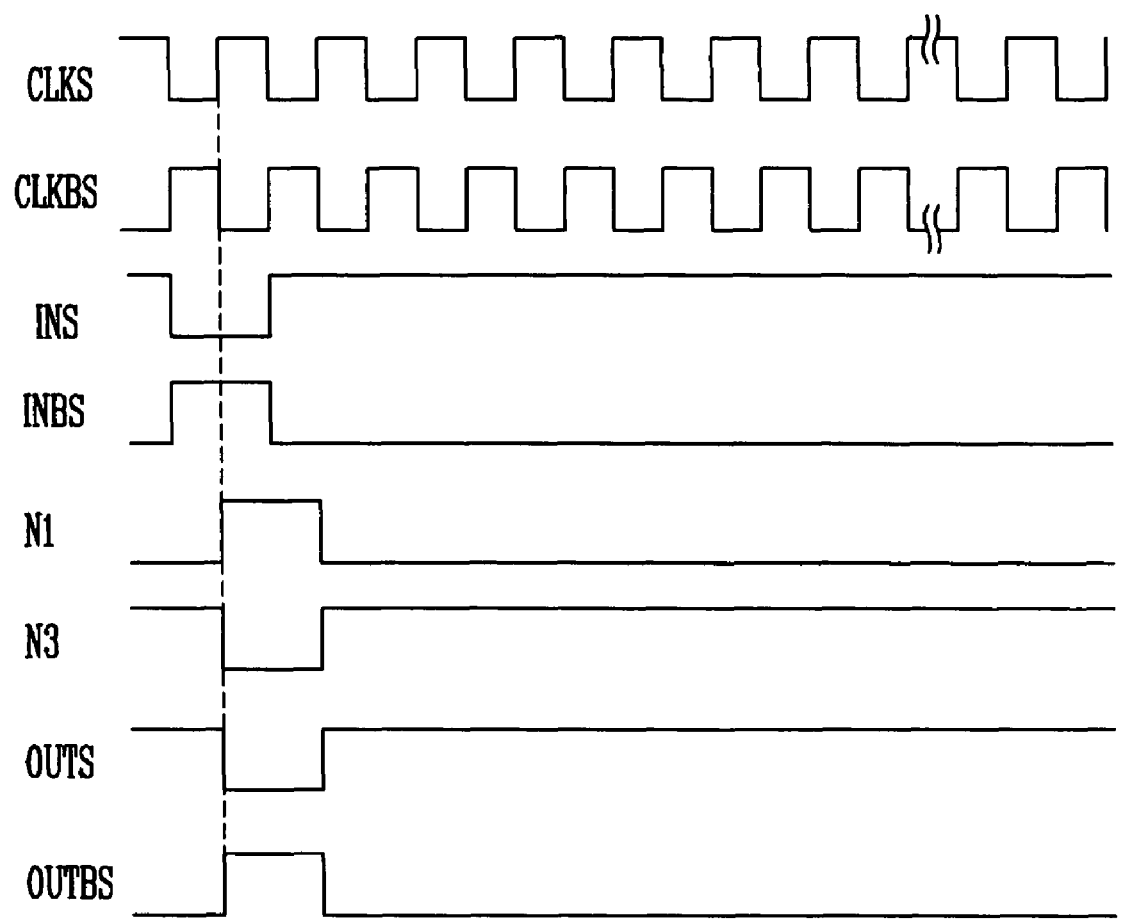
FIG. 5 illustrates a timing diagram of an exemplary operation of the emission driver of FIG. 4.

FIG. 4 illustrates a circuit diagram of a second exemplary embodiment of an emission driver 400' employable by the electroluminescent display of FIG. 1, and FIG. 5 illustrates a timing diagram of an exemplary operation of the emission driver 400' of FIG. 4. Referring to FIG. 4, similar to the first exemplary emission driver 400 shown in FIG. 2, the second exemplary embodiment of the emission driver 400' may include a first signal processor, a second signal processor, a third signal processor, and a fourth signal processor. More particularly, the second exemplary emission driver 400' substantially corresponds to the first exemplary emission driver 400 described in detail above. However, the second exemplary emission driver 400' may include only n-type transistors, e.g., NMOS transistors, whereas the first exemplary emission driver 400 shown in FIG. 2 may include on p-type transistors, e.g., PMOS transistors. That is, in the second exemplary embodiment of one or more aspects of the invention, each of the first, second, third and fourth signal processors may only include n-type transistors, e.g., NMOS transistors. Thus, as may be seen in FIG. 5, signals that may be used to operate the first exemplary emission driver 400' may be inverse of the signals of FIG. 3 that may be used to operate the first exemplary emission driver 400.

The emission driver and the electroluminescent display according to the present invention may implement the emission driver with a PMOS transistor so a circuit of the emission driver may be formed on a substrate when forming a pixel unit of the substrate, simplifying the process and decreasing the size and the weight, etc., of the electroluminescent display, as well as decreasing the cost.

Embodiments of the invention separately may provide an emission control signal having a voltage of the ground power source by decreasing a static current so that signal characteristic(s) of the emission control signal(s) may be improved, e.g., the signal characteristics of the emission control signal(s) may be excellent, and/or a width of a pulse of an output signal of the emission driver and a number of pulses thereof may be controlled based on an input signal supplied to the emission driver.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An emission driver, comprising:
   a first signal processor adapted to receive a clock signal, an input signal and an inverse input signal, and to generate a first output signal;
   a second signal processor adapted to receive the first output signal, an inverse clock signal and negative feedback signals, and to generate a second output signal;
   a third signal processor adapted to receive the second output signal and the input signal, and to generate a third output signal that is an inverse signal to the second output signal; and
   a fourth signal processor adapted to receive the third output signal, and to generate a fourth output signal that is an inverse of the third output signal based on the third output signal,
   wherein the negative feedback signals include the third output signal and the fourth output signal.

2. The emission driver as claimed in claim 1, wherein the first output signal corresponds to the inverse input signal delayed for a predetermined time.

3. The emission driver as claimed in claim 1, wherein the second output signal corresponds to the first output signal corrected based on at least one of the negative feedback signals.

4. The emission driver as claimed in claim 1, wherein the first signal processor comprises:
   a first transistor adapted to control a supply of a driving source voltage corresponding to a driving power source based on the clock signal;
   a second transistor adapted to control the supply of the driving power source voltage supplied through the first transistor to a first node based on the input signal;
   a third transistor adapted to control current flow from the first node to a ground power source based on a voltage of a gate electrode thereof;
   a fourth transistor coupled between a source electrode and the gate electrode of the third transistor, and adapted to control a voltage between the source electrode and the gate electrode of the third transistor based on the input signal;
   a fifth transistor adapted to control a voltage of the gate electrode of the third transistor based on the inverse input signal;
   a sixth transistor coupled between the third transistor and the ground power source, and adapted to perform a switching operation based on the clock signal; and
   a first capacitor having a first terminal coupled to the first node, and a second terminal coupled to a gate terminal of the fourth transistor, the first capacitor adapted to store a voltage corresponding to the gate electrode of the third transistor.

5. The emission driver as claimed in claim 1, wherein the second signal processor includes:
   a seventh transistor coupled to a driving power source and adapted to perform a switching operation based on the inverse clock signal;
   an eighth transistor adapted to perform a switching operation based on the third output signal to transfer a driving source voltage corresponding to the driving power source supplied through the seventh transistor to a first node;
   a ninth transistor adapted to allow current to flow from a second node to a ground power source based on a voltage applied to a gate electrode thereof;
   a tenth transistor coupled between a source electrode and the gate electrode of the ninth transistor and adapted to perform a switching operation based on the input signal to control a voltage between the source and the gate terminals of the ninth transistor;
   an eleventh transistor adapted to control the voltage of the gate electrode of the ninth transistor based on the fourth output signal;
   a twelfth transistor adapted to perform a switching operation based on the inverse clock signal to allow current to flow between the ninth transistor and the ground power source; and
   a second capacitor having a first terminal coupled to the first node, and a second terminal coupled to a drain terminal of the ninth transistor, the second capacitor adapted to store the voltage of the gate electrode of the ninth transistor.

6. The emission driver as claimed in claim 1, wherein the third signal processor comprises:
   a thirteenth transistor adapted to perform a switching operation based on the second output signal to supply a driving power source voltage corresponding to a driving power source to a third node;
   a fourteenth transistor adapted to perform a switching operation based on a voltage of a gate electrode thereof to allow current to flow from the third node to a ground power source;

a fifteenth transistor coupled between a source electrode and the gate electrode of the fourteenth transistor, and adapted to perform a switching operation based on the second output signal to control a voltage between the source and the gate electrodes of the fourteenth transistor;

a sixteenth transistor adapted to perform a switching operation based on the input signal, and to control the voltage of the gate electrode of the fifteenth transistor; and a third capacitor having a first terminal coupled to the third node, and a second terminal coupled to a gate terminal of the fifteenth transistor, the third capacitor adapted to store the voltage of the gate electrode of the fourteenth transistor.

7. The emission driver as claimed in claim 1, wherein the fourth signal processor comprises:

a seventeenth transistor adapted to perform a switching operation based on the third output signal to supply a driving source voltage corresponding to a driving power source to a fourth node;

an eighteenth transistor adapted to perform a switching operation based on a voltage of a gate electrode thereof to allow current to flow from the fourth node to a ground power source;

a nineteenth transistor coupled between a source electrode and the gate electrode of the eighteenth transistor, and adapted to perform a switching operation based on the third output signal to control a voltage between the source and the gate electrodes of the eighteenth transistor;

a twentieth transistor adapted to perform a switching operation based on the second output signal, and to control the voltage of the gate electrode of the eighteenth transistor; and a fourth capacitor having a first terminal coupled to the fourth node, and a second terminal coupled to a gate terminal of the nineteenth transistor, the fourth capacitor adapted to store the voltage of the gate electrode of the eighteenth transistor.

8. The emission driver as claimed in claim 1, wherein the first, second, third and fourth signal processors include a plurality of transistors, and the plurality of transistors are all only one of p-type transistors and n-type transistors such that the first, second, third, and fourth signal processors all include the same type of transistors.

9. An electroluminescent display, comprising:

a pixel unit displaying adapted to display an image based on at least one pixel formed in a region defined by a data line, a scan line and an emission control line;

a data driver adapted to transfer a data signal to the data line;

a scan driver adapted to transfer a scan signal to the scan line; and an emission driver adapted to transfer an emission control signal to the emission control line, wherein the emission driver includes a first signal processor adapted to receive a clock signal, an input signal and an inverse input signal, and to generate a first output signal;

a second signal processor adapted to receive the first output signal, an inverse clock signal and negative feedback signals, and to generate a second output signal;

a third signal processor adapted to receive the second output signal and the input signal, and to generate a third output signal that is an inverse signal to the second output signal; and a fourth signal processor adapted to receive the third output signal, and to generate a fourth output signal that is an inverse of the third output signal based on the third output signal, wherein the negative feedback signals include the third output signal and the fourth output signal.

10. The electroluminescent display as claimed in claim 9, wherein the first output signal corresponds to the inverse input signal delayed for a predetermined time.

11. The electroluminescent display as claimed in claim 9, wherein the second output signal corresponds to the first output signal corrected based on at least one of the negative feedback signals.

12. The electroluminescent display as claimed in claim 9, wherein the first signal processor includes:

a first transistor adapted to control a supply of a driving source voltage corresponding to a driving power source based on the clock signal;

a second transistor adapted to control the supply of the driving power source voltage supplied through the first transistor to a first node based on the input signal;

a third transistor adapted to control current flow from the first node to a ground power source based on a voltage of a gate electrode thereof;

a fourth transistor coupled between a source electrode and the gate electrode of the third transistor, and adapted to control a voltage between the source electrode and the gate electrode of the third transistor based on the input signal;

a fifth transistor adapted to control a voltage of the gate electrode of the third transistor based on the inverse input signal;

a sixth transistor coupled between the third transistor and the ground power source, and adapted to perform a switching operation based on the clock signal; and a first capacitor having a first terminal coupled to the first node, and a second terminal coupled to a gate terminal of the fourth transistor, the first capacitor adapted to store a voltage corresponding to the gate electrode of the third transistor.

13. The electroluminescent display as claimed in claim 9, wherein the second signal processor includes:

a seventh transistor coupled to a driving power source and adapted to perform a switching operation based on the inverse clock signal;

an eighth transistor adapted to perform a switching operation based on the third output signal to transfer a driving source voltage corresponding to the driving power source supplied through the seventh transistor to a first node;

a ninth transistor adapted to allow current to flow from a second node to a ground power source based on a voltage applied to a gate electrode thereof;

a tenth transistor coupled between a source electrode and the gate electrode of the ninth transistor, and adapted to perform a switching operation based on the input signal to control a voltage between the source and the gate terminals of the ninth transistor;

an eleventh transistor adapted to control the voltage of the gate electrode of the ninth transistor based on the fourth output signal;

a twelfth transistor adapted to perform a switching operation based on the inverse clock signal to allow current to flow between the ninth transistor and the ground power source; and a second capacitor having a first terminal coupled to the first node, and a second terminal coupled to a drain terminal of the ninth transistor, the second capacitor adapted to store the voltage of the gate electrode of the ninth transistor.

14. The electroluminescent display as claimed in claim 9, wherein the third signal processor includes:
a thirteenth transistor adapted to perform a switching operation based on the second output signal to supply a driving power source voltage corresponding to a driving power source to a third node;
a fourteenth transistor adapted to perform a switching operation based on a voltage of a gate electrode thereof to allow current to flow from the third node to a ground power source;
a fifteenth transistor coupled between a source electrode and the gate electrode of the fourteenth transistor, and adapted to perform a switching operation based on the second output signal to control a voltage between the source and the gate electrodes of the fourteenth transistor;
a sixteenth transistor adapted to perform a switching operation based on the input signal, and to control the voltage of the gate electrode of the fifteenth transistor; and
a third capacitor having a first terminal coupled to the third node, and a second terminal coupled to a gate terminal of the fifteenth transistor, the third capacitor adapted to store the voltage of the gate electrode of the fourteenth transistor.

15. The electroluminescent display as claimed in claim 9, wherein the fourth signal processor includes:
a seventeenth transistor adapted to perform a switching operation based on the third output signal to supply a driving source voltage corresponding to a driving power source to a fourth node;
an eighteenth transistor adapted to perform a switching operation based on a voltage of a gate electrode thereof to allow current to flow from the fourth node to a ground power source;
a nineteenth transistor coupled between a source electrode and the gate electrode of the eighteenth transistor, and adapted to perform a switching operation based on the third output signal to control a voltage between the source and the gate electrodes of the eighteenth transistor;
a twentieth transistor adapted to perform a switching operation based on the second output signal, and to control the voltage of the gate electrode of the eighteenth transistor; and
a fourth capacitor having a first terminal coupled to the fourth node, and a second terminal coupled to a gate terminal of the nineteenth transistor, the fourth capacitor adapted to store the voltage of the gate electrode of the eighteenth transistor.

16. The electroluminescent display as claimed in claim 9, wherein the first, second, third and fourth signal processors include a plurality of transistors, and the plurality of transistors are all only one of p-type transistors and n-type transistors such that the first, second, third and fourth signal processors all include the same type of transistors.

17. The electroluminescent display as claimed in claim 9, wherein the electroluminescent display is an organic electroluminescent display.

18. An emission control signal driving method, comprising:
receiving a clock signal, an input signal and an inverse input signal;
storing a predetermined voltage corresponding to the input signal;
outputting a signal corresponding to the predetermined voltage and a signal corresponding to an inverse of the predetermined voltage after a predetermined time delay; and
receiving the signal corresponding to the predetermined voltage and correcting the signal corresponding to the predetermined voltage based on an inverse clock signal and negative feedback signals corresponding to the predetermined voltage and the inverse voltage.

19. The emission control signal driving method as claimed in claim 18, further comprising controlling a switch to output the corrected signal corresponding to the predetermined voltage, the corrected output signal having a preset voltage level of power source irrespective of a voltage across the switch.

20. The emission control signal driving method as claimed in claim 19, further comprising inverting the corrected signal and supplying the inverted corrected signal as an emission control signal.

* * * * *